US011514960B2

(12) United States Patent
He

(10) Patent No.: US 11,514,960 B2
(45) Date of Patent: Nov. 29, 2022

(54) PROTECTION CIRCUIT OF MEMORY IN DISPLAY PANEL AND DISPLAY APPARATUS

(71) Applicant: HKC CORPORATION LIMITED, Guangdong (CN)

(72) Inventor: Huailiang He, Guangdong (CN)

(73) Assignee: HKC CORPORATION LIMITED, Guangdong (CN)

( * ) Notice: Subject to any disclaimer, the term of this patent is extended or adjusted under 35 U.S.C. 154(b) by 140 days.

(21) Appl. No.: 17/043,685

(22) PCT Filed: Dec. 19, 2018

(86) PCT No.: PCT/CN2018/122098
§ 371 (c)(1),
(2) Date: Sep. 30, 2020

(87) PCT Pub. No.: WO2020/093538
PCT Pub. Date: May 14, 2020

(65) Prior Publication Data
US 2021/0020212 A1    Jan. 21, 2021

(30) Foreign Application Priority Data
Nov. 6, 2018 (CN) .......................... 201811316062.8

(51) Int. Cl.
G11C 7/24        (2006.01)
G09G 3/20        (2006.01)
(Continued)

(52) U.S. Cl.
CPC ................ G11C 7/24 (2013.01); G11C 5/147 (2013.01); G11C 16/22 (2013.01); G09G 3/20 (2013.01);
(Continued)

(58) Field of Classification Search
CPC .......... G11C 7/24; G11C 16/22; G11C 5/148; G11C 5/147; G09G 3/20; G09G 2230/021; G09G 2230/04; G09G 2230/12
(Continued)

(56) References Cited

U.S. PATENT DOCUMENTS 7,746,329 B2 * 6/2010 Kim .......................... G06F 3/14
345/530
8,115,720 B2 * 2/2012 Choi .................... G09G 3/3648
345/98
(Continued)

FOREIGN PATENT DOCUMENTS

CN    2678275 Y    2/2005
CN    2781505 Y    5/2006
(Continued)

OTHER PUBLICATIONS

First Office Action in counterpart Chinese Application No. 201811316062.8, dated Nov. 14, 2019.
(Continued)

Primary Examiner — Son L Mai

(57) ABSTRACT

Disclosed is a protection circuit of a memory in a display panel. The circuit includes: a timing controller, for outputting a first control signal; a memory, for storing software data of the timing controller; a power supply circuit, for outputting a power signal; and a monitor circuit, having three input ends and a signal output end, two input ends being respectively connected to the power supply circuit and a control signal output end, and the other one input end being input with a write control signal; the monitor circuit controls the memory to be in a write protection state when in a normal state, and controls the memory to be in a write enable
(Continued)

state when a level state collection of the power signal, the first control signal, and the write control signal satisfies a preset level state collection.

17 Claims, 2 Drawing Sheets

(51) Int. Cl.
*G11C 5/14* (2006.01)
*G11C 16/22* (2006.01)

(52) U.S. Cl.
CPC ... *G09G 2330/021* (2013.01); *G09G 2330/04* (2013.01); *G09G 2360/12* (2013.01)

(58) Field of Classification Search
USPC .......................................................... 365/195
See application file for complete search history.

(56) References Cited

U.S. PATENT DOCUMENTS

| | | | | |
|---|---|---|---|---|
| 8,244,925 B2* | 8/2012 | Park | ...................... | G06F 1/3265 |
| | | | | 710/16 |
| 8,508,454 B2* | 8/2013 | Chang | .................. | G09G 3/3648 |
| | | | | 345/212 |
| 8,988,414 B2* | 3/2015 | Lee | .......................... | G09G 3/20 |
| | | | | 345/212 |
| 10,262,742 B2* | 4/2019 | Oh | .......................... | G11C 16/22 |
| 11,171,633 B2* | 11/2021 | Huang | ............... | H03K 3/02335 |
| 2010/0201698 A1* | 8/2010 | Lee | .......................... | G09G 3/20 |
| | | | | 327/202 |

FOREIGN PATENT DOCUMENTS

| | | | |
|---|---|---|---|
| CN | 101004698 | A | 7/2007 |
| CN | 101097315 | A | 1/2008 |
| CN | 201117293 | Y | 9/2008 |
| CN | 201607723 | U | 10/2010 |
| CN | 101960719 | A | 1/2011 |
| CN | 102194410 | A | 9/2011 |
| CN | 102243890 | A | 11/2011 |
| CN | 104282332 | A | 1/2015 |
| CN | 104751814 | A | 7/2015 |
| CN | 105280149 | A | 1/2016 |
| CN | 107430837 | A | 12/2017 |
| CN | 107507643 | A | 12/2017 |
| CN | 107526979 | A | 12/2017 |
| JP | 2013069022 | A | 4/2013 |

OTHER PUBLICATIONS

Second Office Action in counterpart Chinese Application No. 201811316062.8, dated May 15, 2020.
International Search Report in corresponding PCT Application No. PCT/CN2018/122098, dated Jul. 26, 2019.
Written Opinion of the International Searching Authority in corresponding PCT Application No. PCT/CN2018/122098, dated Jul. 26, 2019.

* cited by examiner

PROTECTION CIRCUIT OF MEMORY IN DISPLAY PANEL AND DISPLAY APPARATUS

CROSS REFERENCE TO RELATED APPLICATIONS

The present disclosure is the National Stage of International Application with No. PCT/CN2018/122098, filed Dec. 19, 2018, which claims the benefit of Chinese Patent Application with No. 201811316062.8, filed Nov. 6, 2018 with the National Intellectual Property Administration and entitled "PROTECTION CIRCUIT OF MEMORY IN DISPLAY PANEL AND DISPLAY APPARATUS", the entirety of which is hereby incorporated herein by reference.

TECHNICAL FIELD

The present disclosure relates to the field of display apparatus, and more particularly relates to a protection circuit of a memory in a display panel, and a display apparatus.

BACKGROUND

In a display panel, a timing controller and a memory are connected via a serial communication bus, such as an I2C bus, for data transmission. At the time of power-on, the timing controller reads software data stored in the memory through the serial communication bus (such as an output enable signal OE, a latch signal TP, a frame start signal STV, a polarity inverting signal POL), to complete initialization of the timing controller, thereby controlling a driving circuit to drive the display panel to work. The read and write operations of the timing controller are controlled by a write control signal WP of the memory provided by a computer. The read operation is enabled when the signal WP is at a high level, while the write operation is enabled when the signal WP is at a low level. The memory is in a write protection state when in a normal state, that is, the signal WP is constantly at the high level when the memory is in the normal state.

Generally, the software data has been written into the memory before components being applied on the circuit board PCBA. A power-on test is conducted after a bonding point being completed. At this time, since the signal WP is at the high level, the read operation is enabled. Once the signal WP is pulled down due to an external interference, the read/write operation is enabled. And in this time duration, if the read/write bit on the data line SDA is turned to the write enable state for reasons of line length, high frequency, etc., the software data in the memory has a possibility of being overwritten. Thus, incorrect software data may be read by the timing controller, which results in a failure in its initialization, and even an abnormal display of the display panel when being driven by the timing controller.

SUMMARY

The present disclosure is to provide a protection circuit of a memory in a display panel, aiming to reduce the possibility of software data in the display panel being overwritten.

In an aspect, the present disclosure provides a protection circuit of a memory in a display panel. The protection circuit includes:

a timing controller, having a signal transmission end and a control signal output end, the timing controller being configured to output a first control signal of high/low level;

a memory, having a signal transmission end and a write protection control end, the signal transmission end of the memory being connected to the signal transmission end of the timing controller; the memory being configured to store software data of the timing controller;

a power supply circuit, being configured to output a power signal; and a monitor circuit, having a first input end, a second input end, a third input end, and a signal output end, the first input end being connected to the power supply circuit, the second input end being connected to the control signal output end, the third input end being configured to be input with a write control signal, and the signal output end being connected to the write protection control end;

where the monitor circuit is configured to: output a write protection signal when in a normal state, to control the memory to be in a write protection state; and output a write enable signal to the memory in a case where a level state collection of the power signal, the first control signal, and the write control signal satisfies a preset level state collection, to control the memory to be in a write enable state.

In an embodiment, the timing controller is configured to output the first control signal of high level when in the normal state, and output the first control signal of low level in response to receiving a command of writing data to the memory; the memory is in the write protection state when the write control signal is at high level, and the memory is in the write enable state when the write control signal is at low level; the monitor circuit is configured to perform a logical calculation on levels of the power signal, the first control signal, and the write control signal; the monitor circuit is configured to output the write protection signal, in a case where the power signal is unchanged, and any one of the first control signal and the write control signal is at high level; the monitor circuit is configured to output the write enable signal, in a case where the power signal is unchanged, and both of the first control signal and the write control signal are at low levels.

In an embodiment, the monitor circuit includes a first AND logic circuit, a second AND logic circuit, a reverse circuit, and an OR logic circuit; a first input end of the first AND logic circuit is connected to the power supply circuit, and a second input end of the first AND logic circuit is connected to the control signal output end of the timing controller; a first input end of the second AND logic circuit is connected to the control signal output end of the timing controller via the reverse circuit, and a second input end of the second AND logic circuit is configured to be input with the write control signal; a first input end of the OR logic circuit is connected to an output end of the first AND logic circuit, a second input end of the OR logic circuit is connected to an output end of the second AND logic circuit, and an output end of the OR logic circuit is connected to the write protection control end.

In an embodiment, the power signal and the first control signal are respectively input to the two input ends of the first AND logic circuit; the first AND logic circuit outputs a high level signal when the first control signal is at the high level, and outputs a low level signal when the first control signal is at the low level.

In an embodiment, the second AND logic circuit is configured to perform a logical calculation on the levels of the write control signal and the first control signal after being reversed by the reverse circuit; when the first control signal is at high level, the first control signal is switched to low level after being reversed by the reverse circuit; and when the first control signal is at low level, the first control signal is switched to high level after being reversed by the reverse circuit.

In an embodiment, the OR logic circuit is configured to perform a logical calculation on output levels of the first AND logic circuit and the second AND logic circuit, the logical calculation is configured to output a high level signal when at least one of the two input ends is at the high level, and output a low level signal when both of the two input ends are at the low levels.

In an embodiment, the first AND logic circuit and the second AND logic circuit are configured to monitor the levels of the power signal, the first control signal and the write control signal, so that in a case where the power supply is unchanged, and the first control signal and the write control signal are at low levels, the first AND logic circuit and the second AND logic circuit both output low level signals, and the OR logic circuit outputs a low level signal to the write protection control end of the memory, to enable data to be written to the memory.

In an embodiment, the first AND logic circuit includes a first AND gate, two input ends of the first AND gate are the first input end and the second input end of the first AND logic circuit, and an output end of the first AND gate is the output end of the first AND logic circuit.

In an embodiment, the second AND logic circuit includes a second AND gate, two input ends of the second AND gate are the first input end and the second input end of the second AND logic circuit, and an output end of the second AND gate is the output end of the second AND logic circuit.

In an embodiment, the OR logic circuit includes an OR gate, two input ends of the OR gate are respectively the first input end and the second input end of the OR logic circuit, and an output end of the OR gate is the output end of the OR logic circuit.

In an embodiment, the reverse circuit includes an inverter, an input end of the inverter is the input end of the reverse circuit, and an output end of the inverter is the output end of the reverse circuit.

In an embodiment, a power supply voltage output by the power supply circuit is 3.3V.

In an embodiment, the power supply circuit is a direct current power supply.

In an embodiment, the memory is an electrically erasable programmable read only memory.

In another aspect, the present disclosure provides a protection circuit of a memory in a display panel. The protection circuit includes:
  a timing controller, having a signal transmission end and a control signal output end, the timing controller being configured to output a first control signal of high/low level;
  a memory, having a power supply end, a signal transmission end and a write protection control end, the signal transmission end of the memory being connected to the signal transmission end of the timing controller; the memory being configured to store software data of the timing controller;
  a power supply circuit, an output end of the power supply being connected to the write protection control end and the power supply end of the memory respectively; the power supply circuit being configured to output a power signal; and
  a monitor circuit, having a first input end, a second input end, a third input end, and a signal output end, the first input end being connected to the power supply circuit, the second input end being connected to the control signal output end, the third input end being configured to be input with a write control signal, and the signal output end being connected to the write protection control end;
  where the monitor circuit is configured to: output a write protection signal when in a normal state, to control the memory to be in a write protection state; and output a write enable signal to the memory in a case where a level state collection of the power signal, the first control signal, and the write control signal satisfies a preset level state collection, to control the memory to be in a write enable state.

In still another aspect, the present disclosure provides a display apparatus, including a protection circuit of a memory in a display panel. The specific structures of the protection circuit can refer to the above description, which is not detailed herein.

In an embodiment, the timing controller is configured to output the first control signal of high level when in the normal state, and output the first control signal of low level in response to receiving a command of writing data to the memory; the memory is in the write protection state when the write control signal is at high level, and the memory is in the write enable state when the write control signal is at low level; the monitor circuit is configured to perform a logical calculation on levels of the power signal, the first control signal, and the write control signal; the monitor circuit is configured to output the write protection signal, in a case where the power signal is unchanged, and any one of the first control signal and the write control signal is at high level; the monitor circuit is configured to output the write enable signal, in a case where the power signal is unchanged, and both of the first control signal and the write control signal are at low levels.

In an embodiment, the monitor circuit includes a first AND logic circuit, a second AND logic circuit, a reverse circuit, and an OR logic circuit; a first input end of the first AND logic circuit is connected to the power supply circuit, and a second input end of the first AND logic circuit is connected to the control signal output end of the timing controller; a first input end of the second AND logic circuit is connected to the control signal output end of the timing controller via the reverse circuit, and a second input end of the second AND logic circuit is configured to be input with the write control signal; a first input end of the OR logic circuit is connected to an output end of the first AND logic circuit, a second input end of the OR logic circuit is connected to an output end of the second AND logic circuit, and an output end of the OR logic circuit is connected to the write protection control end.

In accordance with the present disclosure, a protection circuit of a memory in a display panel is consisted of a timing controller, a memory, a power supply circuit and a monitor circuit. By monitoring the power signal of the power supply circuit, the first control signal output by the timing controller according to the read/write command of the memory, and the write control signal provided by a computer, whether data is allowed to be written to the memory is controlled. As such, if any one of the signal levels does not satisfy a data write condition of the memory, the data is not allowed to be written to the memory, so as to improve reliability. Even if the read/write bit on the data line SDA is switched to the write enable state due to line length, high frequency, etc., the write protection signal can prevent the software data in the memory from being overwritten, thereby reducing the probability of the software data in the display panel being overwritten.

BRIEF DESCRIPTION OF THE DRAWINGS

In order to illustrate the technical solution in the embodiments of the present disclosure or the prior art more clearly, brief description would be made below to the drawings required in the embodiments of the present disclosure or the prior art. Obviously, the drawings in the following description are merely some of the embodiments of the present disclosure, and those skilled in the art could obtain other drawings according to the structures shown in the drawings without any creative efforts.

Figure 1:
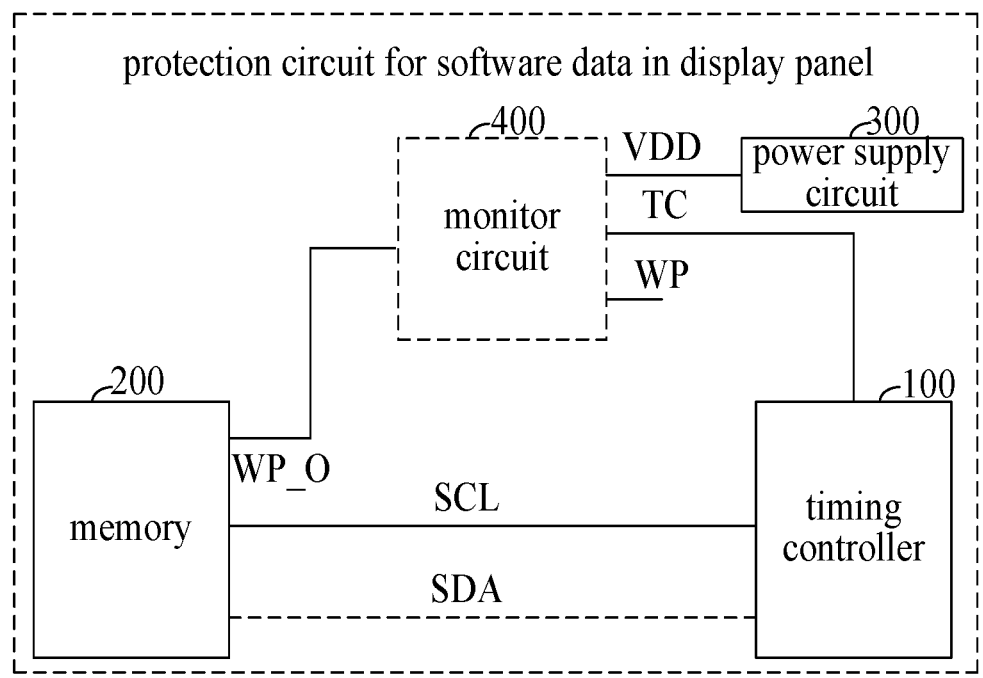
FIG. 1 is a functional block diagram illustrating a protection circuit of a memory in a display panel according to an embodiment of the present disclosure.

The realizing of the aim, functional characteristics and advantages of the present disclosure are further described in detail with reference to the accompanying drawings and the embodiments.

DETAILED DESCRIPTION OF THE EMBODIMENTS

The technical solutions in the embodiments of the present disclosure will be described clearly and completely combining the drawings in the embodiments of the present disclosure. Obviously, the described embodiments are only a part of the embodiments of the present disclosure, but not all of them. Based on the embodiments in the present disclosure, all other embodiments obtained by those skilled in the art without creative work shall belong to the protection scope of the present disclosure.

It should be understand that, all directional indications (such as "upper", "lower", "left", "right", "front", "back" . . . ) in the embodiments of the present disclosure are only used to explain the relative positional relationship, motion, and the like, between components in a certain posture. If the particular posture changes, the directional indication changes accordingly.

In addition, terms such as "first" and "second" are used herein for purposes of description and are not intended to indicate or imply relative importance or to imply the number of indicated technical features. Thus, the features defined with "first" and "second" may comprise or imply at least one of these features. In the description of the present disclosure, "a plurality of" means two or more than two, unless specified otherwise.

In the display panel, the timing controller and the memory are connected via the serial communication bus, such as an I2C bus (including a data line SDA and a clock line SCL) for data transmission. At the time of power-on, the timing controller reads software data stored in the memory through the serial communication bus (such as an output enable signal OE, a latch signal TP, a frame start signal STV, a polarity inverting signal POL), to complete initialization thereof. The read and write operations of the memory are controlled by a write control signal WP of the memory provided by a computer. The read operation is allowed when the signal WP is at the high level, while the write operation is allowed when the signal WP is at the low level. Since the memory is in a write protection state when in a normal state, the signal WP needs to be constantly at the high level in the normal state. The software data has been written into the memory before components are manufactured on the circuit board PCBA. A power-on test is conducted after a binding point is completed. At this time, since the signal WP is at the high level, the read operation is allowed. Once the signal WP is pulled down due to an external interference, the read/write operation is allowed. And during this time, if the read/write bit on the data line SDA is turned to the write enable state for reasons of line length, high frequency, etc., the software data in the memory has a possibility of being overwritten. Thus, the timing controller may read error software data, which results in a failure in its initialization, even causing an abnormal display of the display panel.

In view of the above, the present disclosure provides a protection circuit of a memory in a display panel. Referring to FIG. 1, in an embodiment, the protection circuit includes a memory 100, a timing controller 200, a power supply circuit 300, and a monitor circuit 400.

The timing controller 200 has signal transmission ends and a control signal output end. The memory 100 has signal transmission ends and a write protection control end. The signal transmission ends of the memory 100 are connected to the signal transmission ends of the timing controller 200. The monitor circuit 400 has a first input end, a second input end, a third input end, and a signal output end. The first input end is connected to the power supply circuit 300, the second input end is connected to the control signal output end, the third input end is input with a write control signal WP, and the signal output end is connected to the write protection control end.

In this embodiment, the timing controller 200 has a working voltage of 3.3V, and is configured to output a first control signal TC of a high/low level at its control signal output end. In a normal state, that is, if a command of writing data to the memory 100 is not received, the first control signal TC output by the timing controller 200 may be at the high/low level; and in response to receiving the command of writing data to the memory 100, the first control signal TC output by the timing controller 200 is at the corresponding low/high level.

In this embodiment, the memory 100 may be an electrically erasable programmable read only memory (EEPROM), capable of storing data after power-down, in order to prevent data loss. The memory 100 is configured to store software data of the timing controller 200. In a read state, the timing controller 200 reads the software data in the memory 100 to complete corresponding initialization. After the initialization, various control signals are output to drive the display panel. The memory 100 has a write protection state and a write enable state. When the timing controller 200 reads data from the memory 100, the memory is in the write protection state, to prevent erroneous writing of data. Only when data needs to be written to the memory 100, the memory 100 is switched to the write enable state.

In this embodiment, the power supply circuit 300 may be a DC power supply or a DC power supply transformed from an AC power supply. The power supply circuit 300 is configured to output a power signal VDD. The power signal VDD is a high level signal, and may be set to be 3.3V according to needs.

In this embodiment, the monitor circuit 400 is configured to output a write protection signal when in a normal state, to control the memory 100 to enter in the write protection state; and output a write enable signal when a level state collection of the power signal VDD, the first control signal TC, and the write control signal WP satisfies a preset level state collection, to control the memory 100 to enter in the write enable state. The signal output by the monitor circuit 400 is signal WP_O. The normal state of the monitor circuit 400 refers to that, the monitor circuit 400 outputs the write protection signal to the memory 100, in order to control the memory 100 to enter in the write protection state, in a case where the level state collection of the power signal VDD, the first control signal TC, and the write control signal WP does not satisfy the preset level state collection. The write protection signal and the write enable signal may correspond to two states of the high level and the low level; that is, the monitor circuit 400 outputs two levels of the high level and the low level. Generally, in the normal state, namely the read state, the write control signal WP is configured to be at the high level. By this, the input signal of the write protection control end of the memory 100 may be constantly at the high level, which is equivalent to that the signal WP is constantly at the high level, so that the memory 100 is in the write protection state, whereby preventing the software data in the memory 100 from being overwritten. Correspondingly, the memory 100 is in the write protection state when the monitor circuit 400 outputs the high level signal, and the memory 100 is in the write enable state when the monitor circuit 400 outputs the low level signal. That is, the monitor circuit 400 outputs the high level signal to control the memory 100 to be in the write protection state, and outputs the low level signal to control the memory 100 to be in the write enable state.

In this embodiment, the monitor circuit 400 may perform a logical calculation on levels by using different logic circuits or monitor signal levels by using a switch circuit. The logic circuit may include an AND logic circuit, or an OR logic circuit, a NAND gate circuit, or a combination of at least two different logic circuits; the switch circuit may include a plurality of triodes or MOS transistors. For example, data is allowed to be written to the memory 100, in a case where the power signal VDD, the first control signal TC, and the write control signal WP are all at the high levels. Because the power supply circuit 300 is at the high level when in the normal state, only the levels of the first control signal TC and the write control signal WP need to be set.

Herein an embodiment is provided for understanding. Specifically, the timing controller 200 is configured to output the first control signal TC of the high level when in the normal state, and output the first control signal TC of the low level in response to receiving the command of writing data to the memory 100.

The memory 100 is in the write protection state when the write control signal WP is at the high level, and in the write enable state when the write control signal WP is at the low level.

The monitor circuit 400 is configured to perform the logical calculation on the levels of the power signal VDD, the first control signal TC, and the write control signal WP. In a case where the power signal VDD is unchanged, and any one of the first control signal TC and the write control signal WP is at the high level, the write protection signal is output. In a case where the power signal VDD is unchanged, and both the first control signal TC and the write control signal WP are at the low levels, the write enable signal is output. It will be appreciated that since the power signal VDD is constantly at the high level, only the levels of the first control signal TC and the write control signal WP need to be set, so as to correspond to the read or write state of the memory 100. In this embodiment, when in the normal state, one or both of the first control signal TC and the write control signal WP are set to be at the high levels, so that the memory 100 is in the write protection state; and only when both the first control signal TC and the write control signal WP are at the low levels, the write enable signal is output. As such, only when the levels of the first control signal TC and the write control signal WP are both inverted, the data is enabled to be written; when one of the levels is inverted, the data is not allowed to be written. This can prevent the problem of erroneously writing data to the memory 100 when any one of the first control signal TC and the write control signal WP is changed, which is equivalent to opening one lock with multiple keys, thereby improving the security.

In the related art, whether data is not allowed to be written to the memory 100 is determined by a single protection signal WP. However, in this embodiment, whether data is allowed to be written into the memory 100 is determined by the power signal VDD of the power supply circuit 300, the first control signal TC output according to read and write commands of the memory 100, and the write control signal WP provided by the computer. As such, when any of the three signal levels does not satisfy the data write condition of the memory 100, no data is allowed to be written to the memory 100, improving the reliability. Even if the read/write bit on the SDA data line is turned to the write enable state due to line length, high frequency, etc., the write protection signal can prevent the software data in the memory 100 from being overwritten, thereby reducing the probability of the software data in the memory 100 being rewritten. In addition, since the data in the memory 100 will not be overwritten, rejection rate is lowered, thereby increasing production yield.

Optionally, the memory 100 further has a power supply end. The power supply end of the memory 100 is connected to the power supply circuit 300. In this embodiment, the memory 100 is powered by the power supply circuit 300, and its working voltage may be 3.3V. The signal WP is also 3.3V at the high level, so that one power supply can provide the power supply to the memory 100 and provide a signal which is to combine with other signals for the write protection. As such, in a case where a power failure occurs, the write control signal WP becomes invalid, and the memory 100 is out of operation due to the power loss. At this time, it is impossible to write data to the memory 100. This prevents the data in the memory 100 from being overwritten, thereby to improve the anti-interference ability of the display panel.

Figure 2:
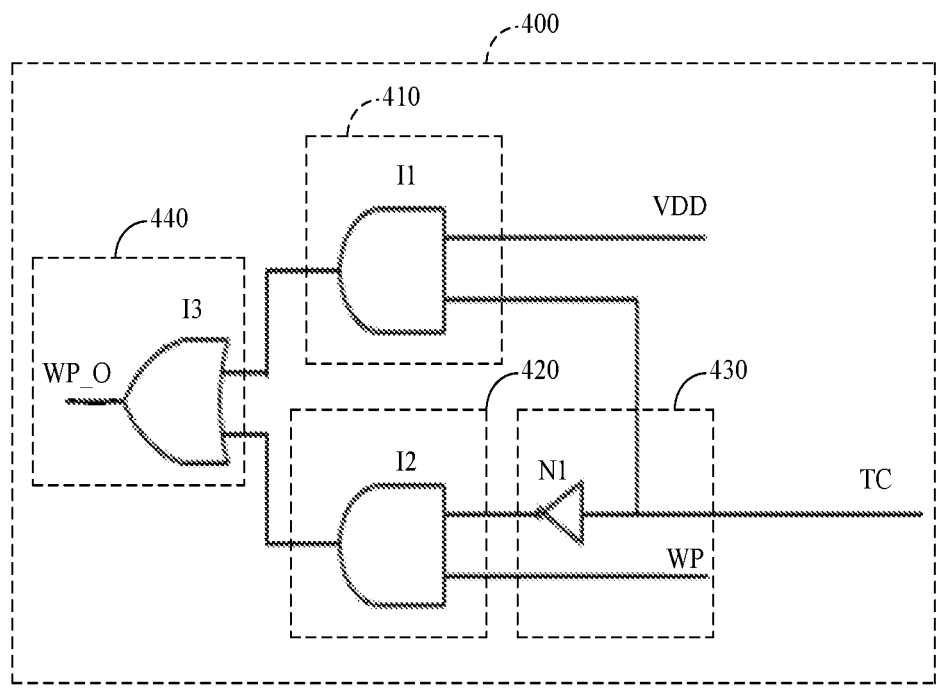
FIG. 2 is a circuit structure diagram illustrating a protection circuit of a memory in a display panel according to an embodiment of the present disclosure.

In an embodiment, the monitor circuit 400 is realized with the following circuit structure. Referring to FIG. 2, the monitor circuit 400 includes a first AND logic circuit 410, a second AND logic circuit 420, a reverse circuit 430, and an OR logic circuit 440.

A first input end of the first AND logic circuit 410 is connected to the power supply circuit 300, and a second input end of the first AND logic circuit 410 is connected to the control signal output end of the timing controller 200.

A first input end of the second AND logic circuit 420 is connected to the control signal output end of the timing controller 200 via the reverse circuit 430, and a second input end of the second AND logic circuit 420 is input with the write control signal WP.

A first input end of the OR logic circuit 440 is connected to an output end of the first AND logic circuit 410, a second input end of the OR logic circuit 440 is connected to an output end of the second AND logic circuit 420, and an output end of the OR logic circuit 440 is connected to the write protection control end.

In this embodiment, the OR logic circuit 440 outputs the write protection signal when the logical calculation result is 1 (representing the high level), and outputs the write enable signal when the logical calculation result is 0 (representing the low level). The first AND logic circuit 410 and the second AND logic circuit 420 may use an AND gate or a NAND gate, the reverse circuit 430 may use an inverter, the logic circuit 440 may use an OR gate. It should be noted that how to implement the above circuits is not limited herein, as long the signal output by the OR logic circuit 440 is the specific level state combination of the power signal VDD, the first control signal TC, and the write control signal WP.

The first AND logic circuit 410 is input with the power signal VDD and the first control signal TC. Since the power signal VDD is constantly at the high level, when the first control signal TC is at the high level, the first AND logic circuit 410 outputs a high level signal; and when the first control signal TC is at the low level, the first AND logic circuit 410 outputs a low level signal. That is, the first AND logic circuit 410 performs the logical calculation on the two signal levels, thereby to realize monitoring of the levels of the input signals.

The second AND logic circuit 420 is configured to perform the logical calculation on the write control signal WP and the first control signal TC after being reversed by the reverse circuit 430. The first control signal TC is switched from the high level to the low level after being reversed by the reverse circuit 430, or switched from the low level to the high level after being reversed by the reverse circuit 430. The logical calculation principle of the second AND logic circuit 420 is the same as that of the first AND logic circuit 410, thus is not detailed herein.

The OR logic circuit 440 is configured to perform the logical calculation on the output levels of the first AND logic circuit 410 and second AND logic circuit 420. The OR logic circuit 440 outputs the signal WP_O of the high level when any of the two input levels is at the high level, and outputs the signal WP_O of the low level when both of the two input levels are at the low levels. Therefore, the output signal WP_O can be used to be the write enable signal when both of the two input levels are at the low levels, and the output signal WP_O can be used to be the write protection signal when any of the two input levels are at the high level.

It should be noted that the first AND logic circuit 410 and the second AND logic circuit 420 monitor the levels of the power signal VDD, the first control signal TC, and the write control signal WP, so that in a case where the power signal VDD is unchanged, and the first control signal TC and the write control signal WP are both at the low levels, the first AND logic circuit 410 outputs the low level signal and the second AND logic circuit 420 outputs the low level signal, so that the OR logic circuit 440 outputs the low level signal to the write protection control end of the memory 100, to control the memory 100 to enter in the write enable state. In a case where any one of the first control signal TC and the write control signal WP is at the high level, the output levels of the first AND logic circuit and the second logic circuit include a high level and a low level; or in a case where both the first control signal TC and the write control signal WP are at the high levels, the output levels of the first AND logic circuit and the second logic circuit include two high levels, and accordingly the OR circuit 440 outputs the high level signal. This high level signal is the write protection signal, so as to control the memory 100 to be in the write protection state.

In this embodiment, the monitor circuit 400 uses the logic circuits that can perform the logical calculations on the three levels, thereby improving monitoring accuracy and easy to implement.

In an embodiment, the first AND logic circuit 410 includes a first AND gate I1. Two input ends of the first AND gate I1 are the first input end and the second input end of the first AND logic circuit 410, and an output end of the first AND gate I1 is the output end of the first AND logic circuit 410. The AND gate performs the logical calculation on two signal levels. The AND gate outputs logic value 0 when an input logic value is 0, and outputs logic value 1 when all the input logic values are 1. In this embodiment, the two input ends of the first AND gate I1 are respectively input with the power signal VDD and the first control signal TC. Since the power signal VDD is always at the high level, that is, the logic value is 1, when the first control signal TC is at the high level, the first AND gate I1 outputs the high level signal, namely the logic value is 1. And when the first control signal TC is at the low level, the first AND gate I1 outputs the low level signal, namely the logic value is 0. That is, the AND gate can implement the logical calculation of the first and logic circuits 410, thereby realizing the monitoring of the level states of the input signals.

In an embodiment, the second AND logic circuit 420 includes a second AND gate I2. Two input ends of the second AND gate I2 are respectively the first input end and the second end of the second AND logic circuit 420, and an output end of the second AND gate I2 is the output end of the second AND logic circuit 420. The logical calculation principle of the second AND gate I2 is the same with that of the first AND gate I1, which is not detailed herein. It should be noted that the second AND gate I2 performs the logical calculation on the write control signal WP and the first control signal TC after being reversed by the reverse circuit 430. The first control signal TC is switched from the high level to the low level after being reversed by the reverse circuit 430.

In an embodiment, the reverse circuit 430 includes an inverter N1. An input end of the inverter N1 is the input end of the reverse circuit 430, and an output end of the inverter N1 is the output end of the reverse circuit 430. The inverter N1 can implement the inverting function of the reverse circuit 430, which inverts the first control signal TC from the high level to the low level. The inverter circuit is easy to implement.

In an embodiment, the OR circuit 440 includes I3, two input ends of I3 are respectively the first input and the second input of the OR logic circuit 440, and an output end of I3 is the output end of the OR logic circuit 440. I3 outputs a logic value 1 when any one of input logic values is 1, and outputs a logic value 0 when all the input logic values are 0. That is, if at least one of the two input ends of I3 is at the high level, the I3 outputs the high level; if both of the input ends of I3 are at the low levels, I3 outputs the low level. In this embodiment, I3 realizes the logical calculation of the OR logic circuit 440, namely the logical calculation on the results of the first AND logic circuit 410 and the second AND logic circuit 420, so that in a case where the power signal VDD is unchanged, and both the first control signal TC and the write control signal WP are at the low levels, the first AND logic circuit 410 and the second AND logic circuit 420 output the low level signals, and accordingly the OR logic circuit 440 outputs the low level signal to the memory 100, to allow the memory 100 in the write enable state.

In an embodiment, the first AND logic circuit 410 includes the first AND gate I1, the second AND logic circuit 420 includes the second AND gate I2, the reverse circuit 430 includes the inverter N1, and the OR logic circuit 440 includes the I3.

The first input end of the first AND gate I1 is connected to the power supply circuit 300, and the second input end of the first AND gate I1 is connected to the control signal output end of the timing controller 200.

The first input end of the second AND gate I2 is connected to the control signal output end of the timing controller 200 via the inverter N1, and the second input end of the second AND gate I2 is input with the write control signal WP.

The first input end of the I3 is connected to the output end of the first AND gate I1, the second input end of the I3 is connected to the output end of the second AND gate I2, and the output end of the I3 is connected to the write protection control end.

The timing controller 200 is configured to output the first control signal TC of the high level when in the normal state, and output the first control signal TC of the low level when receiving the command of writing data to the memory 100.

The memory is in the write protection state when the write control signal WP is at the high level, and in the write enable state when the write control signal WP is at the low level.

In this embodiment, in the normal state, the first control signal TC is at the high level, the power signal VDD is at the high level (the power signal level is not easily pulled down by an external circuit, that is, it is not easy to change, with high reliability), and the write control signal WP is at the high level. Thus, the first AND gate I1 outputs the high level signal, the second AND gate I2 outputs the low level signal, and the I3 outputs the high level signal, so that data is not allowed to be written to the memory 100. When the write control signal WP is pulled to the low level due to external influence, the first AND gate I1 still outputs the high level signal, the second AND gate I2 outputs the low level signal, and the I3 outputs the high level signal. In addition, it is assumed that when the first control signal TC is pulled low, the write control signal WP is normally at the high level, the first AND gate I1 outputs the low level signal, the second AND gate I2 outputs the high level signal, and the I3 outputs the high level signal. Only when the power supply circuit outputs the high level, the first control signal TC and the write control signal WP are both at the low levels, the signal WP_O output by the I3 is at the low levels, so that the memory is in the write enable state. Referring to TABLE 1, TABLE 1 illustrates the logical relationship of the power signal VDD, the first control signal TC, and the write control signal WP as well as the output signal WP_O.

TABLE 1

| input | | | output |
|---|---|---|---|
| VDD | WP | TC | WP_O |
| 1 | 0 | 1 | 1 |
| 1 | 1 | 1 | 1 |
| 1 | 0 | 0 | 0 |
| 1 | 1 | 0 | 1 |
| 0 | 0 | 0 | 0 |
| 0 | 1 | 0 | 1 |
| 0 | 0 | 1 | 0 |
| 0 | 1 | 1 | 0 |

As can be seen from the first four sets of data in the table, when the power supply circuit is powered up normally, only under one condition that the first control signal TC and the write control signal WP are both at low levels, the signal WP_O output from the I3 is at the low level, so that data is allowed to be written to the memory. And under any of the other conditions, data is not allowed to be written to the memory. Therefore, the present disclosure can prevent the software data in the memory 100 from being overwritten.

In addition, the present disclosure further provides a display panel, which includes the protection circuit of the memory in the display panel. Thus, the display panel incorporates all the technical solutions of all the embodiments of the protection circuit, and can also achieve the same technical effects, which are detailed herein.

In the embodiments, the display panel 150 includes, but is not limited to, a Liquid Crystal Display panel, an Organic Light Emitting Diode Display panel, a Field Emission Display panel, a Plasma Display panel, and a Curved Surface panel. The Liquid Crystal Display panel includes a Thin Film Transistor Liquid Crystal Display panel, a Twisted Nematic (TN) panel, a Vertical Alignment (VA) panel, an In-Plane Switching (IPS) panel, etc.

Figure 3:
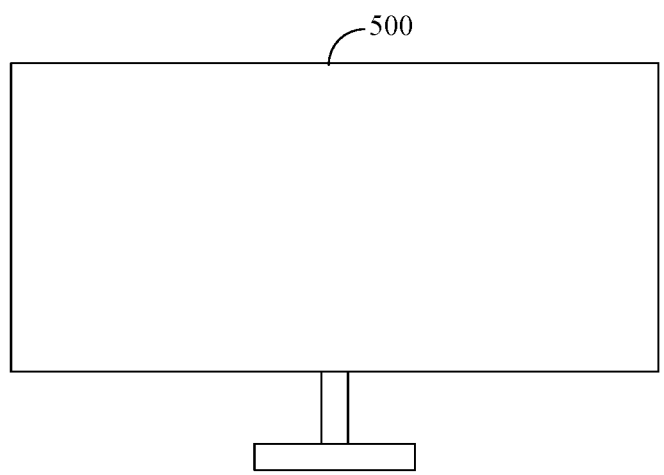
FIG. 3 is a structure diagram illustrating a display apparatus according to an embodiment of the present disclosure.

In addition, referring to FIG. 3, the present disclosure further provides a display apparatus 500, which includes the protection circuit of the memory in the display panel. Thus, the display apparatus 500 incorporates all the technical solutions of all the embodiments of the protection circuit, and can also achieve the same technical effects, which are detailed herein. It should be noted that the display apparatus 500 may be a general display or a flat panel television, etc., may also be a liquid crystal display or a liquid crystal television.

The foregoing are only illustrative embodiments in accordance with the present disclosure and therefore not intended to limit the patentable scope of the present disclosure. Any equivalent structure or flow transformations that are made taking advantage of the specification and accompanying drawings of the disclosure and any direct or indirect applications thereof in other related technical fields are within the protection scope of the present disclosure.

What is claimed is:

1. A protection circuit of a memory in a display panel, comprising:
    a timing controller, having a signal transmission end and a control signal output end, the timing controller being configured to output a first control signal of high/low level;
    a memory, having a signal transmission end and a write protection control end, the signal transmission end of the memory being connected to the signal transmission end of the timing controller; the memory being configured to store software data of the timing controller;
    a power supply circuit, being configured to output a power signal; and
    a monitor circuit, having a first input end, a second input end, a third input end, and a signal output end, the first input end being connected to the power supply circuit, the second input end being connected to the control signal output end, the third input end being configured to be input with a write control signal, and the signal output end being connected to the write protection control end;
    wherein the monitor circuit is configured to:
    output a write protection signal when in a normal state, to control the memory to be in a write protection state; and
    output a write enable signal to the memory in a case where a level state collection of the power signal, the first control signal, and the write control signal satisfies a preset level state collection, to control the memory to be in a write enable state;

wherein,
the timing controller is further configured to output the first control signal of high level when in the normal state, and output the first control signal of low level in response to receiving a command of writing data to the memory;
the memory is in the write protection state when the write control signal is at high level, and the memory is in the write enable state when the write control signal is at low level;
the monitor circuit is further configured to perform a logical calculation on levels of the power signal, the first control signal, and the write control signal; the monitor circuit is configured to output the write protection signal, in a case where the power signal is unchanged, and any one of the first control signal and the write control signal is at high level; the monitor circuit is configured to output the write enable signal, in a case where the power signal is unchanged, and both of the first control signal and the write control signal are at low levels.

2. The protection circuit of claim 1, wherein the monitor circuit comprises a first AND logic circuit, a second AND logic circuit, a reverse circuit, and an OR logic circuit;
a first input end of the first AND logic circuit is connected to the power supply circuit, and a second input end of the first AND logic circuit is connected to the control signal output end of the timing controller;
a first input end of the second AND logic circuit is connected to the control signal output end of the timing controller via the reverse circuit, and a second input end of the second AND logic circuit is configured to be input with the write control signal;
a first input end of the OR logic circuit is connected to an output end of the first AND logic circuit, a second input end of the OR logic circuit is connected to an output end of the second AND logic circuit, and an output end of the OR logic circuit is connected to the write protection control end.

3. The protection circuit of claim 2, wherein the power signal and the first control signal are respectively input to the first input end and the second input end of the first AND logic circuit;
the first AND logic circuit is configured to output a high level signal when the first control signal is at high level, and output a low level signal when the first control signal is at low level.

4. The protection circuit of claim 2, wherein the second AND logic circuit is configured to perform a logical calculation on the levels of the write control signal and the first control signal after being reversed by the reverse circuit;
the first control signal is switched to low level after being reversed by the reverse circuit, when the first control signal is at high level; and
the first control signal is switched to high level after being reversed by the reverse circuit, when the first control signal is at low level.

5. The protection circuit of claim 2, wherein the OR logic circuit is configured to perform a logical calculation on output levels of the first AND logic circuit and the second AND logic circuit; the logical calculation of the OR logic circuit is configured to output a high level signal in a case where at least one of the two input ends is at high level, and output a low level signal in a case where both of the two input ends are at low levels.

6. The protection circuit of claim 2, wherein the first AND logic circuit and the second AND logic circuit are configured to monitor the levels of the power signal, the first control signal and the write control signal, so that in a case where the power supply is unchanged, and the first control signal and the write control signal are at low levels, the first AND logic circuit and the second AND logic circuit both output low level signals, and the OR logic circuit outputs a low level signal to the write protection control end of the memory, to enable data to be written to the memory.

7. The protection circuit of claim 2, wherein the first AND logic circuit comprises a first AND gate;
two input ends of the first AND gate are the first input end and the second input end of the first AND logic circuit, and an output end of the first AND gate is the output end of the first AND logic circuit.

8. The protection circuit of claim 2, wherein the second AND logic circuit comprises a second AND gate;
two input ends of the second AND gate are the first input end and the second input end of the second AND logic circuit, and an output end of the second AND gate is the output end of the second AND logic circuit.

9. The protection circuit of claim 2, wherein the OR logic circuit comprises an OR gate;
two input ends of the OR gate are the first input end and the second input end of the OR logic circuit, and an output end of the OR gate is the output end of the OR logic circuit.

10. The protection circuit of claim 2, wherein the reverse circuit comprises an inverter;
an input end of the inverter is the input end of the reverse circuit, and an output end of the inverter is the output end of the reverse circuit.

11. The protection circuit of claim 1, wherein a power supply voltage output by the power supply circuit is 3.3V.

12. The protection circuit of claim 1, wherein the power supply circuit is a direct current power supply.

13. The protection circuit of claim 1, wherein the memory is an electrically erasable programmable read only memory.

14. A protection circuit of a memory in a display panel, comprising:
a timing controller, having a signal transmission end and a control signal output end, the timing controller being configured to output a first control signal of high/low level;
a memory, having a power supply end, a signal transmission end and a write protection control end, the signal transmission end of the memory being connected to the signal transmission end of the timing controller; the memory being configured to store software data of the timing controller;
a power supply circuit, an output end of the power supply being connected to the write protection control end and the power supply end of the memory respectively; the power supply circuit being configured to output a power signal; and
a monitor circuit, having a first input end, a second input end, a third input end, and a signal output end, the first input end being connected to the power supply circuit, the second input end being connected to the control signal output end, the third input end being configured to be input with a write control signal, and the signal output end being connected to the write protection control end;
wherein the monitor circuit is configured to:
output a write protection signal when in a normal state, to control the memory to be in a write protection state; and
output a write enable signal to the memory in a case where a level state collection of the power signal, the first control signal, and the write control signal satisfies a preset level state collection, to control the memory to be in a write enable state;

wherein, the timing controller is further configured to output the first control signal of high level when in the normal state, and output the first control signal of low level in response to receiving a command of writing data to the memory;

the memory is in the write protection state when the write control signal is at high level, and the memory is in the write enable state when the write control signal is at low level;

the monitor circuit is further configured to perform a logical calculation on levels of the power signal, the first control signal, and the write control signal; the monitor circuit is configured to output the write protection signal, in a case where the power signal is unchanged, and any one of the first control signal and the write control signal is at high level; the monitor circuit is configured to output the write enable signal, in a case where the power signal is unchanged, and both of the first control signal and the write control signal are at low levels.

15. A display apparatus, comprising a protection circuit of a memory in a display panel, the protection circuit comprising:

a timing controller, having a signal transmission end and a control signal output end, the timing controller being configured to output a first control signal of high/low level;

a memory, having a signal transmission end and a write protection control end, the signal transmission end of the memory being connected to the signal transmission end of the timing controller; the memory being configured to store software data of the timing controller;

a power supply circuit, being configured to output a power signal; and a monitor circuit, having a first input end, a second input end, a third input end, and a signal output end, the first input end being connected to the power supply circuit, the second input end being connected to the control signal output end, the third input end being configured to be input with a write control signal, and the signal output end being connected to the write protection control end;

wherein the monitor circuit is configured to:

output a write protection signal when in a normal state, to control the memory to be in a write protection state; and output a write enable signal to the memory in a case where a level state collection of the power signal, the first control signal, and the write control signal satisfies a preset level state collection, to control the memory to be in a write enable state;

wherein, the timing controller is further configured to output the first control signal of high level when in the normal state, and output the first control signal of low level in response to receiving a command of writing data to the memory;

the memory is in the write protection state when the write control signal is at high level, and the memory is in the write enable state when the write control signal is at low level;

the monitor circuit is further configured to perform a logical calculation on levels of the power signal, the first control signal, and the write control signal; the monitor circuit is configured to output the write protection signal, in a case where the power signal is unchanged, and any one of the first control signal and the write control signal is at high level; the monitor circuit is configured to output the write enable signal, in a case where the power signal is unchanged, and both of the first control signal and the write control signal are at low levels.

16. The display apparatus of claim 15, wherein, the timing controller is configured to output the first control signal of high level when in the normal state, and output the first control signal of low level in response to receiving a command of writing data to the memory;

the memory is in the write protection state when the write control signal is at high level, and the memory is in the write enable state when the write control signal is at low level;

the monitor circuit is configured to perform a logical calculation on levels of the power signal, the first control signal, and the write control signal; the monitor circuit is configured to output the write protection signal, in a case where the power signal is unchanged, and any one of the first control signal and the write control signal is at high level; the monitor circuit is configured to output the write enable signal, in a case where the power signal is unchanged, and both of the first control signal and the write control signal are at low levels.

17. The display apparatus of claim 15, wherein the monitor circuit comprises a first AND logic circuit, a second AND logic circuit, a reverse circuit, and an OR logic circuit;

a first input end of the first AND logic circuit is connected to the power supply circuit, and a second input end of the first AND logic circuit is connected to the control signal output end of the timing controller;

a first input end of the second AND logic circuit is connected to the control signal output end of the timing controller via the reverse circuit, and a second input end of the second AND logic circuit is configured to be input with the write control signal;

a first input end of the OR logic circuit is connected to an output end of the first AND logic circuit, a second input end of the OR logic circuit is connected to an output end of the second AND logic circuit, and an output end of the OR logic circuit is connected to the write protection control end.

* * * * *